US011131931B2

(12) United States Patent
Hsieh et al.

(10) Patent No.: US 11,131,931 B2
(45) Date of Patent: Sep. 28, 2021

(54) FLUIDIC LEAKAGE HANDLING FOR SEMICONDUCTOR APPARATUS

(71) Applicant: Taiwan Semiconductor Manufacturing Co., Ltd., Hsinchu (TW)

(72) Inventors: Fu-Chun Hsieh, Hsinchu (TW); Pei-Yi Su, Taichung (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 2 days.

(21) Appl. No.: 16/438,253

(22) Filed: Jun. 11, 2019

(65) Prior Publication Data

US 2020/0004156 A1     Jan. 2, 2020

Related U.S. Application Data

(60) Provisional application No. 62/692,263, filed on Jun. 29, 2018.

(51) Int. Cl.
| | |
|---|---|
| *H01L 21/67* | (2006.01) |
| *G01M 3/04* | (2006.01) |
| *B05C 5/00* | (2006.01) |
| *G01M 3/16* | (2006.01) |
| *G03F 7/16* | (2006.01) |

(Continued)

(52) U.S. Cl.
CPC ............ *G03F 7/2041* (2013.01); *B05C 5/001* (2013.01); *G01M 3/04* (2013.01); *G01M 3/16* (2013.01); *G01M 3/18* (2013.01); *G03F 7/003* (2013.01); *H01L 21/6715* (2013.01);

(Continued)

(58) Field of Classification Search
CPC .......... H01L 21/6715; H01L 21/67017; H01L 21/67051; G03F 7/162; B05C 5/001; B05C 11/1042; B05B 9/002
See application file for complete search history.

(56) References Cited

U.S. PATENT DOCUMENTS

| | | |
|---|---|---|
| 8,027,019 B2 | 9/2011 | Kemper et al. |
| 8,541,309 B2 | 9/2013 | Rye et al. |

(Continued)

FOREIGN PATENT DOCUMENTS

| | | |
|---|---|---|
| TW | 201207577 A | 2/2012 |
| TW | 201351488 A | 12/2013 |

(Continued)

*Primary Examiner* — Binu Thomas
(74) *Attorney, Agent, or Firm* — Sterne, Kessler, Goldstein & Fox P.L.L.C.

(57) ABSTRACT

The present disclosure describes a leakage handling device and a method for handling a fluid leakage in a semiconductor manufacturing apparatus. The semiconductor manufacturing apparatus can include a lithography apparatus with a chuck configured to hold a substrate, and a photoresist feeder configured to dispatch a coating material on one or more areas of the substrate. The photoresist feeder can include a photoresist cartridge configured to output the coating material, a conduit fluidly connected to the photoresist cartridge, and a fluid leakage handling device disposed above the chuck, where the conduit can be configured to fluidly transport the coating material and circulate a coolant and the fluid leakage handling device can be configured to detect a fluid leakage from the conduit.

20 Claims, 5 Drawing Sheets

(51) Int. Cl.
*G03F 7/20* (2006.01)
*G03F 7/00* (2006.01)
*G01M 3/18* (2006.01)

(52) U.S. Cl.
CPC .. *H01L 21/67017* (2013.01); *H01L 21/67253* (2013.01); *G03F 7/162* (2013.01)

(56) References Cited

U.S. PATENT DOCUMENTS

| | | | |
|---|---|---|---|
| 9,235,138 | B2 | 1/2016 | Cortie et al. |
| 9,853,330 | B2 * | 12/2017 | Matthe .................. G01M 3/165 |
| 2004/0098212 | A1 * | 5/2004 | Hong ...................... G01M 3/18 |
| | | | 702/51 |
| 2004/0265154 | A1 * | 12/2004 | McDowell ............ F04B 43/009 |
| | | | 417/474 |
| 2011/0227721 | A1 * | 9/2011 | Mezghani ................. F17D 5/06 |
| | | | 340/539.1 |
| 2013/0302525 | A1 * | 11/2013 | Tanaka ................... B05C 5/001 |
| | | | 427/372.2 |
| 2013/0333447 | A1 * | 12/2013 | White ....................... F17D 5/06 |
| | | | 73/40.5 R |
| 2020/0043708 | A1 * | 2/2020 | Konno .............. H01L 21/67017 |
| 2020/0072696 | A1 * | 3/2020 | Chen ....................... G01M 3/18 |

FOREIGN PATENT DOCUMENTS

| | | | | |
|---|---|---|---|---|
| TW | 201706704 A | | 2/2017 | |
| WO | WO-2008099769 A1 * | | 8/2008 | ............. B41J 29/00 |

* cited by examiner

FLUIDIC LEAKAGE HANDLING FOR SEMICONDUCTOR APPARATUS

CROSS-REFERENCE TO RELATED APPLICATIONS

This application claims benefit of U.S. Provisional Patent Application No. 62/692,263, titled "Design Cup Wash Trigger Timing By Sensor," filed on Jun. 29, 2018, the disclosure of which is incorporated by reference in its entirety.

BACKGROUND

With advances in semiconductor technology, there has been an increasing demand for high yield and throughput of the lithography process for manufacturing semiconductor devices. To meet these demands, it is crucial to prevent lithography apparatus failures to ensure a reliable lithography process.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

Illustrative embodiments will now be described with reference to the accompanying drawings. In the drawings, like reference numerals generally indicate identical, functionally similar, and/or structurally similar elements.

DETAILED DESCRIPTION

Figure 1:
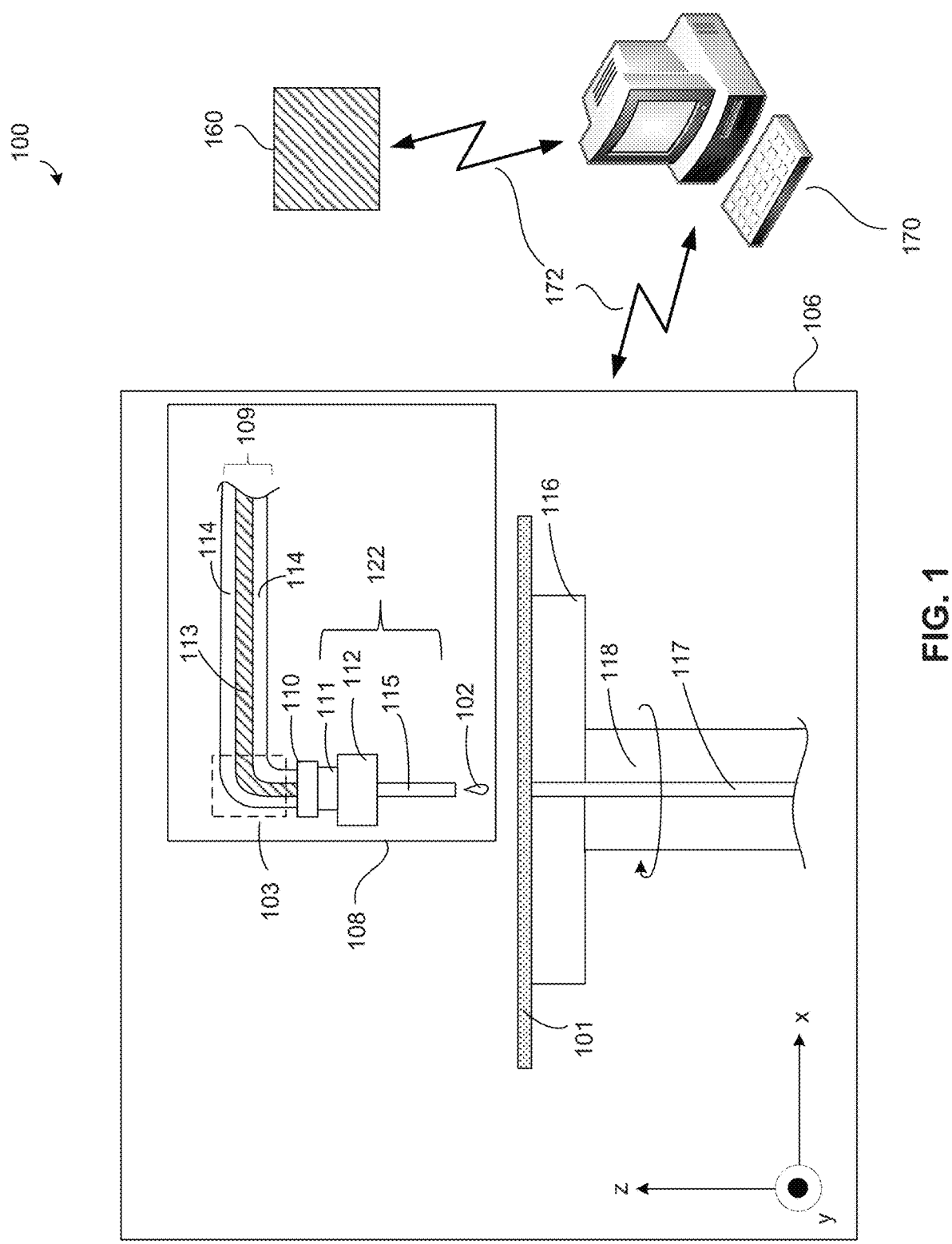
FIG. 1 illustrates a plan view of a lithography apparatus, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature on or over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "about" indicates the value of a given quantity that can vary based on a particular technology node associated with the subject semiconductor device. In some embodiments, based on the particular technology node, the term "about" can indicate a value of a given quantity that varies within, for example, 5-30% of the value (e.g., ±5%, ±10%, ±20%, or ±30% of the value).

The term "substantially" as used herein indicates the value of a given quantity that can vary based on a particular technology node associated with the subject semiconductor device. In some embodiments, based on the particular technology node, the term "substantially" can indicate a value of a given quantity that varies within, for example, ±5% of a target (or intended) value.

A lithography process is widely used to define various patterns on semiconductor wafers for a semiconductor device fabrication. The lithography process can include a photoresist coating process to form a photoresist film on each of the semiconductor wafers. During the photoresist coating process, a photoresist can be provided by a photoresist storage bottle, delivered through a photoresist pipe fluidly connected to the photoresist storage bottle, and dispatched on one or more surface areas of each semiconductor wafer with a dispensing nozzle fluidly connected to the photoresist pipe. Each of the semiconductor wafers can be spun to form a centrifugal force to distribute the dispatched photoresist over the entire wafer surface. Such spinning can continue until the photoresist film with desired characteristics (e.g., film thickness, film uniformity, or surface coverage) is formed on each semiconductor wafer. However, the characteristics of the photoresist film can be sensitive to various environmental variables, such as temperature and humidity. Therefore, a fluctuation of environment variables can drastically impact an overall yield and quality of the photoresist coating process. For example, a change of photoresist temperature associated with an environment temperature fluctuation can alter a viscosity of the photoresist. Such viscosity variation can affect an adhesion or a fluid transportation property of the photoresist on the semiconductor wafer surface, and thus impact a surface coverage and a thickness uniformity of the respective photoresist film. As a result, it is desirable to deliver the photoresist in a stabilized temperature environment before reaching the dispensing nozzle.

A temperature-control component can be applied to ensure the temperature stability while delivering the photoresist from the photoresist storage bottle to the dispensing nozzle through the photoresist pipe. The temperature-control component can be a circulation pipe that surrounds and contacts the photoresist pipe, in which a coolant (e.g., water) can flow through the circulation pipe to regulate or maintain the photoresist temperature in the photoresist pipe. However, the circulation pipe can be bent by frequent movements of the photoresist pipe and the dispensing nozzle during the photoresist coating process. Such bending can break the circulation pipe and cause coolant to leak onto the semiconductor wafer, resulting in semiconductor wafer yield issues.

The present disclosure is directed to a fluid leakage handling device and a method for detecting and collecting a fluidic leakage from a circulation pipe of a semiconductor manufacturing apparatus (e.g., a lithography apparatus). In some embodiments, the fluid leakage handling device can include a disc and a fluid leakage sensor disposed in the disc. The disc can surround the circulation pipe or a photoresist cartridge of a lithography apparatus. The disc can be configured to collect a leaked coolant from the circulation pipe. The fluid leakage sensor can be configured to detect the leaked coolant collected in the disc. In some embodiments, the fluid leakage handling device can be configured to communicate with a controller unit, which can adjust one or more operations of the lithography apparatus in response to detection of leaked coolant.

FIG. 1 illustrates a plan view of a lithography apparatus 100 configured to conduct a lithography process on a substrate (e.g., a wafer 101), according to some embodiments. Lithography apparatus 100 can include a photoresist coating module 106 configured to coat a coating material 102 (e.g., a photoresist or any other fluidic organic material) on the substrate (e.g., wafer 101), and an illumination module 160 configured to condition a radiation beam for irradiating the substrate. Lithography apparatus 100 can also include a controller unit 170 configured to communicate with photoresist coating module 106 and illumination module 160 via a communication mechanism 172. In some embodiments, lithography apparatus 100 can further include other modules not included in FIG. 1, such as a projection module configured to direct the radiation beam to expose the substrate or a supporting structure configured to hold a photo mask, where each of the other modules can be further configured to communicate with controller unit 170 via communication mechanism 172.

Photoresist coating module 106 can include a chuck 116 configured to hold wafer 101, a spindle 118 configured to provide a rotation mechanism for chuck 116, and a photoresist feeder 108 configured to dispatch coating material 102 onto one or more areas of wafer 101. In some embodiments, photoresist coating module 106 can have multiple photoresist feeders 108, where each photoresist feeder 108 can be configured to dispatch different species of coating material 102. For illustration purposes, FIG. 1 includes selected portions of photoresist coating module 106 and other components, such as robotic arms, pumps, solvent banks, and drains, are not shown.

Wafer 101 to be coated can be mounted face-up on chuck 116 so that the one or more top surface areas of wafer 101 can receive coating material 102 from photoresist feeder 108. Chuck 116 can be stationary or rotated by spindle 118 to provide a centrifugal force to spread and distribute the dispatched coating material 102 across wafer 101's top surface. In some embodiments, a passage structure 117 can be included in photoresist coating module 106 and embedded in chuck 116 and spindle 118, where a vacuum suction can be provided through passage structure 117 to secure wafer 101 on chuck 116.

Photoresist feeder 108 can include a photoresist cartridge 122 configured to output coating material 102, a fluid conduit 109 fluidly connected to photoresist cartridge 122, and a fluid leakage handling device 110 configured to capture and detect a fluid leakage of fluid conduit 109. Photoresist feeder 108 can be mobile in photoresist coating module 106, such that photoresist feeder 108 can be moved between a space above chuck 116 and another location in photoresist coating module 106. For example, photoresist feeder 108 can be grabbed by a robotic arm (not shown in FIG. 1) of photoresist coating module 106 and be moved between chuck 116 and a solvent bank (not shown in FIG. 1) of photoresist coating module 106, where the solvent bank can be configured to preserve a cleanliness of photoresist cartridge 122. Photoresist feeder 108 can also be positioned above multiple areas of chuck 116 to dispatch coating material 102 on multiple areas of wafer 101.

Photoresist cartridge 122 can include a photoresist dispensing nozzle 115 configured to dispense coating material 102, and a holder 112 configured to house photoresist dispensing nozzle 115 and fluid conduit 109. In some embodiments, photoresist cartridge 122 can further include a connector 111 to secure a connection between fluid conduit 109 and holder 112. Photoresist dispensing nozzle 115 can be a tapered or straight-bore pipe structure (not shown in FIG. 1) configured to receive coating material 102 from fluid conduit 109 and dispense coating material 102 to wafer 101 secured on chuck 116. In some embodiments, photoresist dispensing nozzle 115 can further include a chamber (not shown in FIG. 1) connected to the tapered or straight-bore pipe structure, where an enclosure of the chamber can be configured to store coating material 102 provided by fluid conduit 109. Holder 112 can include a handle structure (not shown in FIG. 1) for a robotic arm of photoresist coating module 106 to carry photoresist cartridge 122. For example, the robotic arm can grab holder 112's handle structure to move holder 112, together with photoresist dispensing nozzle 115 and fluid conduit 109, between multiple locations in photoresist coating module 106.

Fluid conduit 109 can include a photoresist pipe 113 configured to transport coating material 102 to photoresist cartridge 122. An end of photoresist pipe 113 can be fluidly connected to photoresist dispensing nozzle 115, and another end of photoresist pipe 113 to be connected to a pump (not shown in FIG. 1) configured to extract coating material 102 from a photoresist storage container (not shown in FIG. 1) and drive coating material 102 flowing to photoresist cartridge 122. Fluid conduit 109 can further include a circulation pipe 114 surrounding and contacting photoresist pipe 113, where circulation pipe 114 can be configured to circulate a coolant (e.g., water) to stabilize or regulate a temperature of coating material 102 in photoresist pipe 113. Both photoresist pipe 113 and circulation pipe 114 can be made of a soft material (e.g., a plastic material), thus being bendable, extendable, and retractable. As a result, both photoresist pipe 113 and circulation pipe 114 can include one or more bending/stretching segments 103, where the one or more bending/stretching segments 103 can allow fluid conduit 109 and photoresist cartridge 122 to be mobile in photoresist coating module 106. In some embodiments, bending/stretching segments 103 of circulation pipe 114 can have one or more leakage spots that leaks coolant from circulation pipe 114, thus contaminating wafer 101.

Fluid leakage handling device 110 can include a container (not shown in FIG. 1) configured to capture a fluid leaked from fluid conduit 109 (referred to herein as a "fluid leakage"), such as the coolant leaked from circulation pipe 114 or coating material 102 leaked from photoresist pipe 113. Fluid leakage handling device 110 can further include a fluidic sensor (not shown in FIG. 1) configured to detect the fluid leakage, where the fluidic sensor can be further configured to communicate with controller unit 170 via communication mechanism 172. Fluid leakage handling device 110 can be disposed above chuck 116. For example, fluid leakage handling device 110 can be placed at or near an outer surface of fluid conduit 109 or at an outer surface of photoresist cartridge 122. In some embodiments, fluid leakage handling device 110 can be disposed between photoresist cartridge 122 and chuck 116, where photoresist cartridge 122 can dispense coating material 102 on wafer 101 through fluid leakage handling device 110.

In some embodiments, lithography apparatus 100 can further include another fluid leakage module (not shown in FIG. 1) configured to detect a fluid leakage in lithography apparatus 100, where fluid leakage handling device 110 can be configured to communicate with the other fluid module, and the other fluid module can be configured to communicate with controller unit 170.

Controller unit 170 can include any suitable computer system (e.g., workstation and portable electronic device) to store programs and data for various operations of each module of lithography apparatus 100, to instruct lithography apparatus 100 to conduct the lithography process on a substrate. For example, controller unit 170 can be configured to instruct photoresist coating module 106 to conduct the photoresist coating process on wafer 101 placed on chuck 116, including controlling a displacement of photoresist feeder 108 or a rotation of chuck 116. The different functions of controller unit 170 should not be limited by the embodiments of the present disclosure. Communication mechanism 172 can include any suitable network connection between controller unit 170 and each module of lithography apparatus 100. For example, communication mechanism 172 can include a local area network (LAN) and/or a WiFi network. In some embodiments, controller unit 170 can transmit control signals through communication mechanism 172 to control the rotation of chuck 116 or the displacement of photoresist feeder 108.

In some embodiments, even though lithography apparatus 100 is considered here, fluid leakage handling device 110 can be included in other semiconductor manufacturing apparatuses. For example, the other semiconductor manufacturing apparatus can be a dry-etching apparatus or an ion implantation apparatus (not shown in FIG. 1), which can include a fluid conduit (e.g., similar to fluid conduit 109) having a circulation pipe 114, where fluid leakage handling device 110 can be attached to or placed at or near an outer surface of the fluid conduit or circulation pipe 114.

Figure 2A:
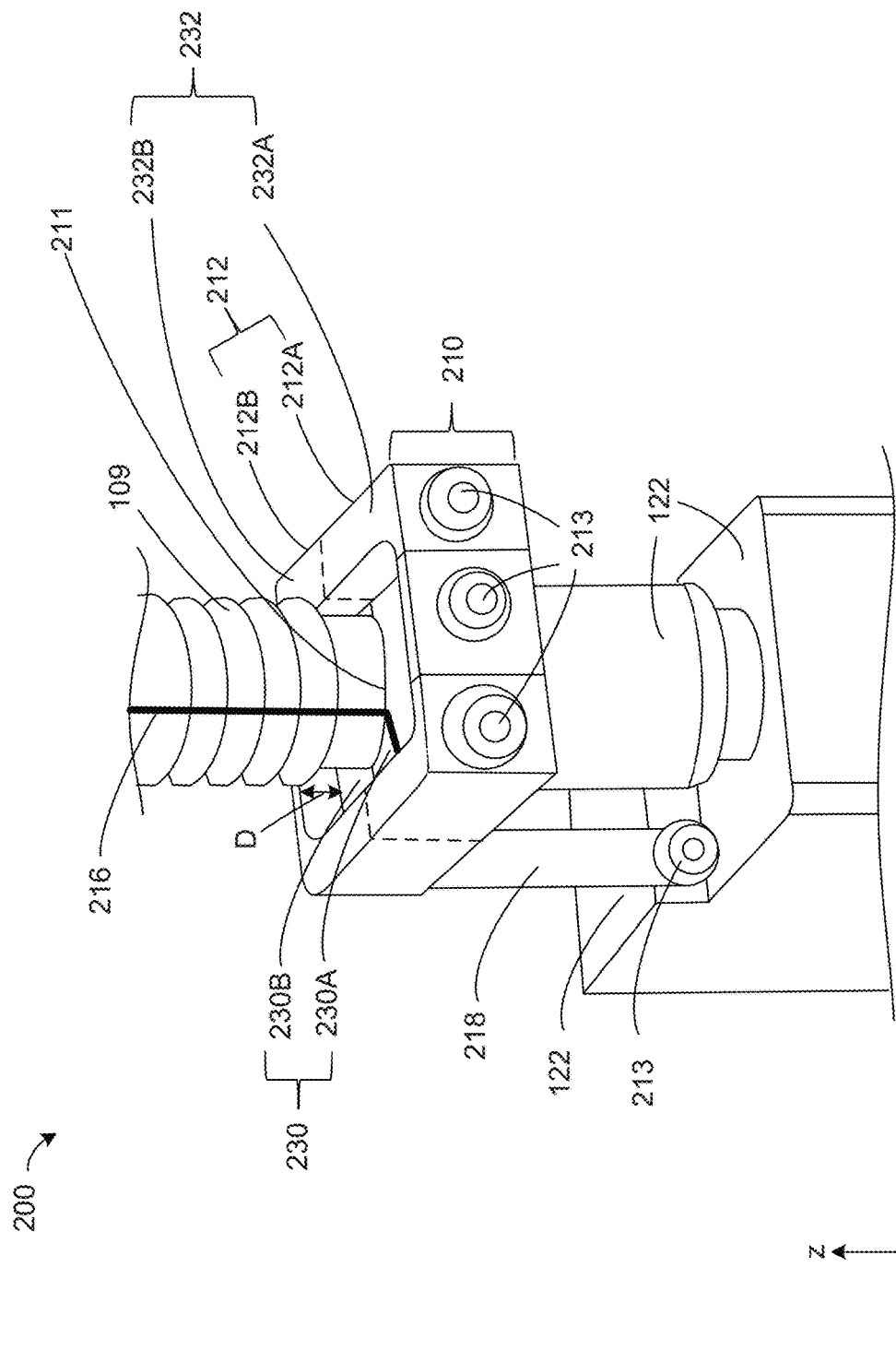
FIG. 2A illustrates an isometric view of a photoresist feeder, according to some embodiments.

FIG. 2A illustrates an isometric view of a photoresist feeder 200, according to some embodiments. The discussion of photoresist feeder 108 applies to photoresist feeder 200 unless mentioned otherwise. Photoresist feeder 200 can include photoresist cartridge 122, fluid conduit 109 fluidly connected to photoresist cartridge 122, and a fluid leakage handling device 210, where the discussion of fluid leakage handling device 110 applies to fluid leakage handling device 210, unless mentioned otherwise.

Fluidic leakage handling device 210 can include a disc 212 configured to capture fluid leakage, and a fluid leakage sensor 216 configured to detect the fluid leakage collected by disc 212. Disc 212 can include a recess region 230 and a bulge region 232 surrounding recess region 230, where recess region 230 can have any suitable depth D compared to bulge region 232 to allow the fluid leakage being timely collected and detected. For example, depth D can be sufficiently shallow to allow a minimum amount of collected fluid leakage to be detected by fluid leakage sensor 216. In some embodiments, depth D can be between about 0.2 cm to about 3 cm. In some embodiments, depth D can be between about 0.5 cm to about 2 cm. In some embodiments, depth D can be between about 0.7 cm to about 1.5 cm.

In some embodiments, disc 212 can be any container that can be configured to hold the fluid leakage, such as a plate, a dish, a tank, a bucket, or any other suitable container.

Recess region 230 can further include an opening 211 configured to accommodate photoresist cartridge 122 or fluid conduit 109. For example, as shown in FIG. 2A, fluid leakage handling device 210 can be placed at an outer surface of fluid conduit 109, where disc 212 can surround fluid conduit 109 such that fluid conduit 109 can be extended through opening 211 in recess region 230. As a result, the fluid leakage from fluid conduit 109 can be collected in recess region 230. In some embodiments, recess region 230 can tightly contact and seal fluid conduit 109 such that no gap is formed between recess region 230 and fluid conduit 109.

In some embodiments, fluid leakage handling device 210 can be placed at an outer surface of photoresist cartridge 122, where disc 212 can surround photoresist cartridge 122 such that photoresist cartridge 122 can be extended through opening 211 in recess region 230. In some embodiments, recess region 230 can tightly contact and seal photoresist cartridge 122 such that no gap is formed between recess region 230 and photoresist cartridge 122.

In some embodiments, fluid leakage handling device 210 can be disposed between photoresist cartridge 122 and chuck 116 (not shown in FIG. 2A), where disc 212 can be held by a supporting mechanism (e.g., a robotic arm, not shown in FIG. 2A) and placed above chuck 116. In some embodiments, disc 212 can be placed under photoresist cartridge 122 and configured to allow coating material 102 to be fluidly dispensed to chuck 116 through opening 211.

In some embodiments, disc 212 can be an assembly of multiple discs. For example, as shown in FIG. 2A, disc 212 can be an assembly of plates 212A-212B, where each plate 212A/212B can respectively include a recess region 230A/230B and a bulge region 232A/232B such that recess region 230 can be an assembly of recess regions 230A-230B and bulge region 232 can be an assembly of bulge regions 232A-232B. Plates 212A-212B can be attached to each other with multiple mechanical components 213 (e.g., screws and/or clamps). The assembly of plates 212A-212B (e.g., disc 212) can be further fixed on a holder 218, where holder 218 can be secured on photoresist cartridge 122 with one or more mechanical components 213.

In some embodiments, even though two plates 212A-212B are shown in FIG. 2A, disc 212 can be an assembly of more than two plates similar to plates 212A-212B. In some embodiments, disc 212 can be an assembly of multiple plates, where recess region 230 can be an assembly of recess regions of a first group of the multiple plates, and bulge region 232 can be an assembly of bulge regions of a second group of the multiple plates.

In some embodiments, disc 212 can be an assembly of multiple plates, where a depth of a recess region of a first group of the multiple plates can be different from that of a second group of the multiple plates. For example, a depth between recess region 230A and bulge region 232A can be different from that between recess region 230B and bulge region 232B, such that a surface of resulting recess region 230 can be slanted towards a horizontal direction (e.g., a direction parallel to x-y plane).

In some embodiments, disc 212 can be an assembly of multiple plates, where one or more of the multiple plates can each have a recess region with a slanted surface. For example, recess regions 230A-230B can each have a slanted surface, such that recess region 230 can be slanted towards fluid conduit 109 or photoresist cartridge 122.

In some embodiments, disc 212 can be a single disc having recess region 230 and bulge region 232, where recess region 230 can have a flat or a slanted surface.

In some embodiments, fluidic leakage handling device 210 can include multiple discs similar to disc 212, where each of a first group of the multiple discs can be a single disc having recess region 230 and bulge region 232, and each of a second group of the multiple discs can be an assembly of multiple plates similar to plates 212A-212B.

Fluid leakage sensor 216 can be an electric-type fluid detector configured to detect the fluid leakage collected in recess region 230, and can include multiple conductive wires and an electric module configured to monitor a resistance change between the multiple conductive wires. As shown in FIG. 2A, an end of the multiple conductive wires of fluid leakage sensor 216 can be placed in recess region 230, while another end of the conductive wires can be electrically connected to the electric module (not shown in FIG. 2A) of fluid leakage sensor 216. In response to the multiple conductive wire being in contact with the leakage fluid collected in recess region 230, the leakage fluid can electrically bridge the multiple conductive wires, thus causing the resistance change between the multiple electrical wires. The electric module of fluid leakage sensor 216 can detect the such resistance change associated with the leakage fluid in recess region 230 and trigger a respective communication to inform or alert controller unit 170 (not shown in FIG. 2A).

In some embodiments, fluid leakage sensor 216 can be an acoustic-type fluid detector configured to detect a level of the fluid leakage collected in recess region 230. Fluid leakage sensor 216 can include an acoustic module (not shown in FIG. 2A) placed above recess region 230, where the acoustic module can be configured to transmit and receive one or more acoustic signals associated the level of fluid leakage collected in recess region 230. For example, the acoustic module can be configured to detect a phase difference between the transmitted and the received acoustic signals to determine an actual fluid level of the fluid leakage in recess region 230. In response to a fluid level detected in recess region 230 being above a pre-determined threshold, fluid leak sensor 216 can be configured to trigger a respective communication to inform or alert controller unit 170.

In some embodiments, fluid leakage sensor 216 can be an image sensor configured to detect a level of the fluid leakage collected in recess region 230. For example, fluid leakage sensor 216 can include a camera with a flexible gooseneck cable, where the flexible gooseneck cable can be placed above recess region 230 to record images of the fluid level in recess region 230. The image sensor of fluid leakage sensor 216 can be configured to generate image data having any suitable resolution (e.g., 640 pixel×480 pixels), greyscale (e.g., 256 combinations of shades of gray), chrominance, or frame rate (e.g., 30 pictures per second). The image data can be sent to controller unit 170 for further analysis, such as performing a computing procedure, including one or more mathematical operations, to analyze the images. In some embodiments, the computing procedure can further include a pattern recognition procedure to analyze imaging information, such as contrasts and brightness, in the images provided by the image sensor of fluid leakage sensor 216. In some embodiments, the computing procedure can also include a machine learning procedure to predict an accumulation of fluid leakage in recess region 230, where the machine learning procedure can include a neural network algorithm or any regression-based procedures.

In some embodiments, fluid leakage sensor 216 can include one or more of the electric-type fluid detector, acoustic type fluid detector, or an imaging sensor.

Figure 2B:
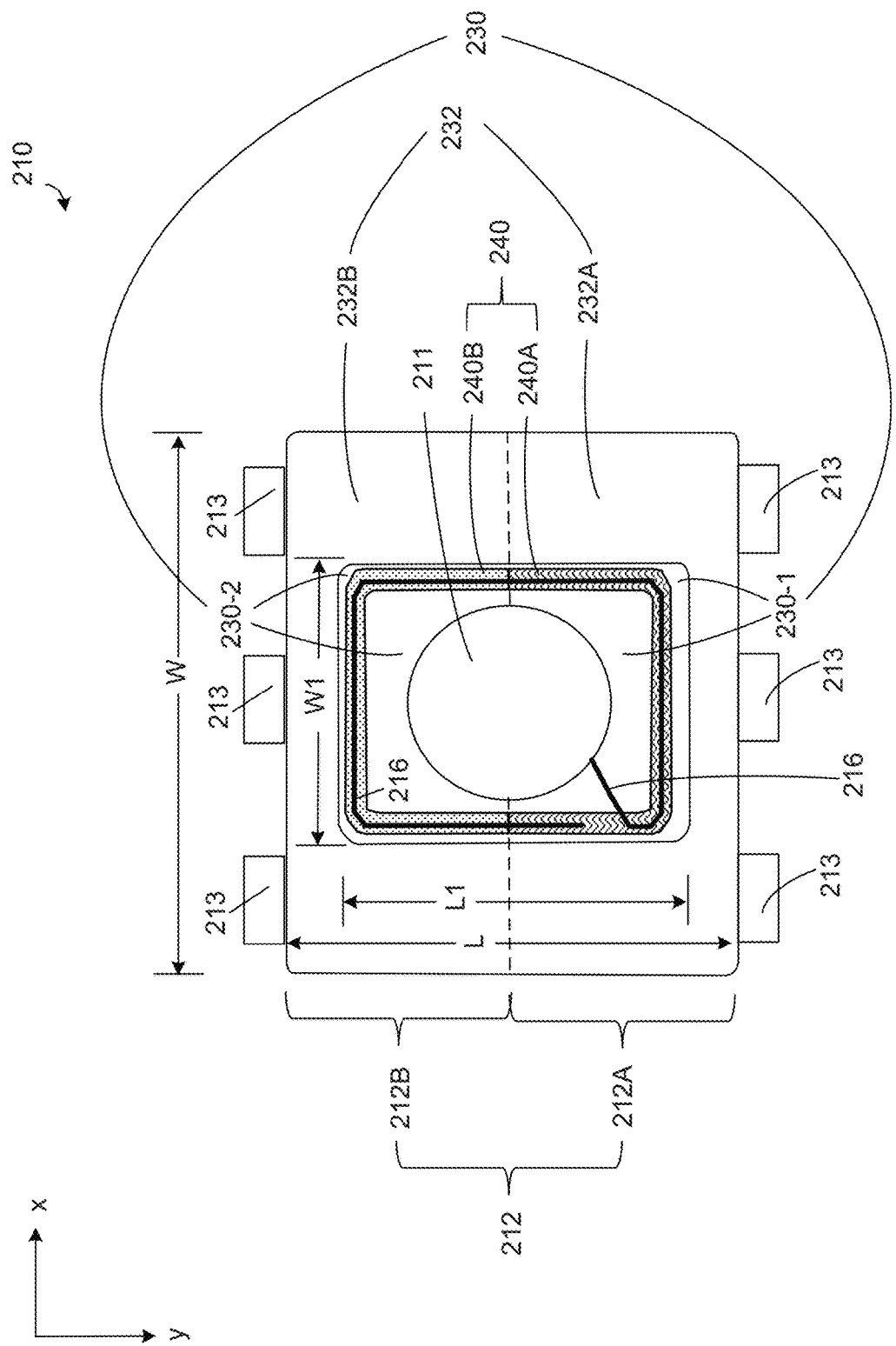
FIG. 2B illustrates a top view of a fluidic leakage handling device, according to some embodiments.

FIG. 2B illustrates a top view of fluidic leakage handling device 210, according to some embodiments. The discussion of elements with the same annotations in FIGS. 2A-2B applies to each other unless mentioned otherwise. As shown in FIG. 2B, recess region 230 can have any suitable shape (along the x-y plane) that is sufficient for collecting the fluid leakage from all directions. A dimension of recess region 230 along a horizontal direction (e.g. along x- or y-direction) can be substantially greater than a respective horizontal dimension of opening 211 such that a sufficient space can be formed between bulge region 232 and opening 211 to collect the fluid leakage from all directions. For example, recess region 230 can be a rectangular shape along the x-y plane, where a length L1 and a width W1 of recess region 230 can each be greater than a diameter of opening 211. In some embodiments, a length L1 of recess region 230 along the y-axis can be between about 3 cm and about 10 cm, and a width W1 of recess region 230 along the x-axis can be between 3 cm and about 10 cm. In some embodiments, a length L1 of recess region 230 along the y-axis can be between about 4 cm and about 9 cm, and a width W1 of recess region 230 along the x-axis can be between 4 cm and about 9 cm. In some embodiments, a length L1 of recess region 230 along the y-axis can be between about 5 cm and about 8 cm, and a width W1 of recess region 230 along the x-axis can be between 5 cm and about 8 cm.

Referring to FIG. 2B, recess region 230 can further include a groove structure 240 disposed at a top surface of recess region 230, where groove structure 240 can be extended along a perimeter of recess region 230, and configured to accommodate fluid leakage sensor 216. For example, fluid leakage sensor 216 can be an electric-type fluid sensor with multiple conductive wires, where the multiple conductive wires can be further placed in groove structure 240. Since groove structure 240 has a relatively lower level than other portions of recess region 230, any fluid leakage collected by recess region 230 can be accumulated in groove structure 240 and detected by the multiple conductive wires of fluid leakage sensor 216. Groove structure 240 can have any suitable width and depth sufficient to accommodate fluid leakage sensor 216 and/or store the collected fluid leakage. In some embodiments, groove structure 240 can have a width between 0.5 cm and 2 cm, and a depth between 0.5 cm and 5 cm. In some embodiments, groove structure 240 can have a width between 0.7 cm and 1.7 cm, and a depth between 0.7 cm and 4 cm. In some embodiments, groove structure 240 can have a width between 0.9 cm and 1.5 cm, and a depth between 0.7 cm and 3 cm.

In some embodiments, disc 212 can be an assembly of multiple plates, where groove structure 240 can be an assembly of groove structures (e.g., groove structure 240A-240B) of a first and a second group of the multiple plates.

Bulge region 232 can have any suitable shape (along the x-y plane) and dimension that is sufficient to surround recess region 230. For example, bulge region 232 can be a rectangular shape along the x-y plane, where a length L and a width W of bulge region 232 can be respectively greater than length L1 and width W1 of recess region 230. In some embodiments, length L of bulge region 232 along the y-axis can be between about 8 cm and about 15 cm, and width W of bulge region 232 along the x-axis can be between 8 cm and about 15 cm. In some embodiments, length L of bulge region 232 along the y-axis can be between about 9 cm and about 14 cm, and width W of bulge region 232 along the x-axis can be between 9 cm and about 14 cm. In some embodiments, length L of bulge region 232 along the y-axis can be between about 10 cm and about 13 cm, and width W of bulge region 232 along the x-axis can be between 10 cm and about 13 cm.

In some embodiments, a center of opening 211 can overlap or significantly be close to a center of recess region 230. In some embodiments, opening 211 can be located at any off-centered portion of recess region 230, where a center of opening 221 can be located at a different location from a center of recess region 230.

Figure 3:
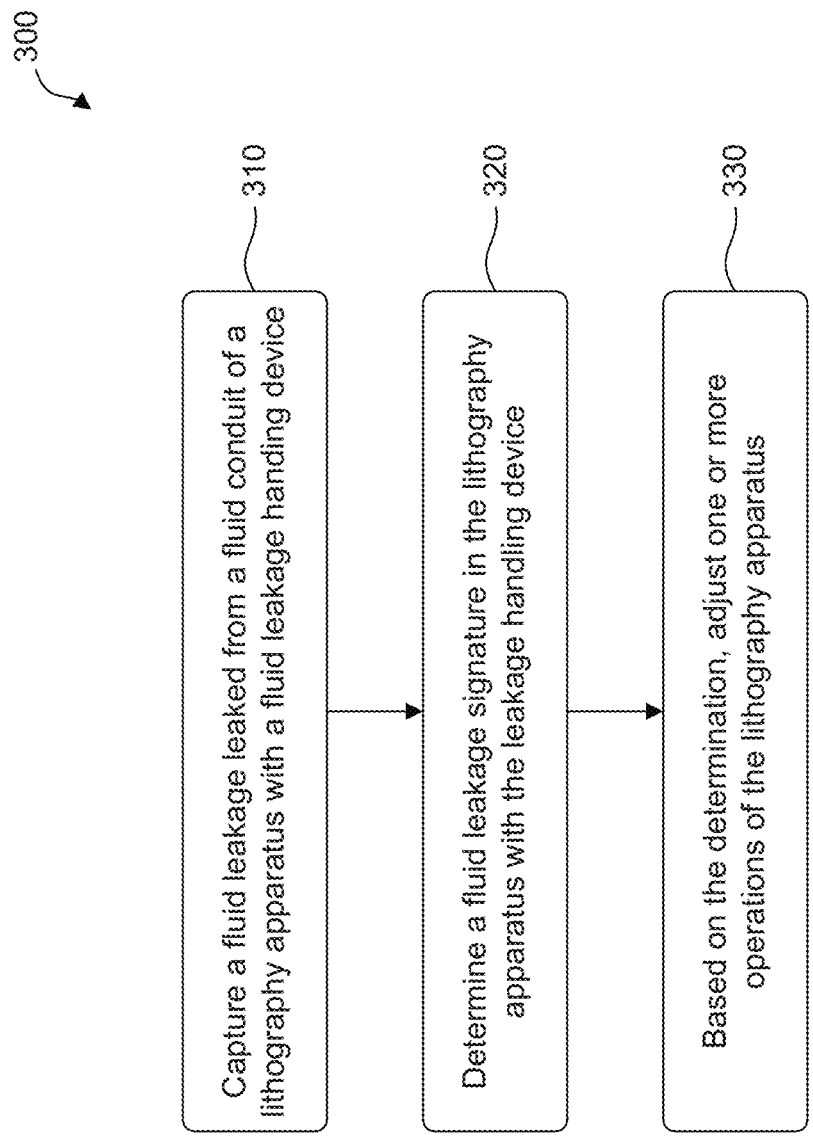
FIG. 3 illustrates a method for operating a lithography apparatus, according to some embodiments.

FIG. 3 is a method 300 for operating a lithography apparatus, according to some embodiments of the present disclosure. Operations shown in method 300 are not exhaustive; other operations can be performed as well before, after, or between any of the illustrated operations. In some embodiments, operations of method 300 can be performed in a different order. Variations of method 300 are within the scope of the present disclosure.

Method 300 begins with operation 310, where a fluid leakage leaked from a fluid conduit of a lithography apparatus is captured by a fluid leakage handing device. The fluid leakage handing device can be placed surrounding the fluid conduit or a photoresist cartridge of the lithography apparatus to collect the fluid leakage from the fluid conduit. For example, the fluid leakage handling device can include a disc, where the disc can surround the fluid conduit or the photoresist cartridge by slipping the fluid conduit or the photoresist cartridge through an opening of the disc, such that the fluid conduit or the photoresist conduit can pass through and be surrounded by the disc. A junction between the disc and an outer surface of the fluid conduit or the photoresist cartridge can be further sealed with additional mechanical tightening, or a padding layer, such as o-rings, gaskets, cottons, sealants, or any other suitable material. As a result, any fluid leakage from the fluid conduit can be captured and collected by the disc of the fluid handling device, thus preventing fluid leakage dripping on a substrate or any other components of the lithography apparatus. In some embodiments, the disc can be placed surrounding the fluid conduit or the photoresist cartridge by assembling multiple partial-discs to surround the fluid conduit or a photoresist cartridge. For example, each of the multiple plates can be secured to each other and attached to outer surfaces of the fluid conduit or the photoresist cartridge with various mechanical components, such as screws and clamps. Details of operation 310 can be referred to the descriptions of FIGS. 1 and 2A-2B.

In operation 320, a fluid leakage signature in the lithography apparatus is determined with the fluid leakage handling device. The fluid leakage signature can include an existence of the fluid leakage leaked from the fluid conduit and a morphology of the fluid leakage collected in the disc, such as discontinuous liquid droplets or a continuous fluid plane. The determination of the fluid leakage signature can include placing a fluid leakage sensor of the fluid leakage handling device above or in the disc and monitoring an electrical, acoustic, or visual characteristic of the fluid leakage signature with the fluid leakage sensor. For example, the fluid leakage sensor can be an electrical-type fluid detector which can include multiple conductive wires placed above the disc, where the monitored electrical characteristic of the fluid leakage signature can include detection of a resistance change between the multiple conductive wires. In response to the fluid leakage collected in the disc contacting the multiple conductive wires, the collected fluid leakage can electrically bridge the multiple conductive wires, thus causing an resistance change between the multiple conductive wires. Since the multiple conductive wires are placed above the disc, such resistance change detected by the fluid leakage sensor can indicate fluid leakage from the fluid conduit, where the fluid leakage collected and accumulated in the disc has a continuous fluid plane. In some embodiments, the multiple conductive wires of the electrical-type fluid detector are placed in the disc, where a resistance change detected by the fluid leakage sensor can imply an existence of the fluid leakage leaked from the fluid conduit, where the fluid leakage collected in the disc can be multiple droplets (e.g., the fluid leakage may have just started or the amount of fluid leakage is insignificant). Details of operation 320 can be referred to the descriptions of FIGS. 2A-2B.

In some embodiments, the fluid leakage sensor can be an acoustic-type fluid detector placed above the disc, where the monitoring the acoustic characteristic of the fluid leakage signature can include transmitting an acoustic signal to the disc, receiving the acoustic signal bounced from the disc, and comparing a phase difference or a amplitude difference between the transmitted and the received acoustic signal. A variation of the phase difference or the amplitude difference detected by the fluid leakage sensor can indicate fluid leakage from the fluid conduit, where the fluid leakage collected and accumulated in the disc has formed a continuous fluid plane.

In some embodiments, the fluid leakage sensor can be an image sensor placed above the disc, where the monitoring the visual characteristic associated with the fluid leakage signature can include recording images of a top surface of the disc. Images of droplets or a continuous fluid plane in the disc recorded by the image sensor can indicate fluid leakage from the fluid conduit and the morphology (e.g., droplets or the continuous fluid plane) of the fluid leakage collected in the disc.

In operation 330, one or more operations of the lithography apparatus are adjusted based on the determination of the fluid signature in the lithography apparatus. The adjustment can include aborting an on-going photoresist coating process and/or a subsequent photoresist coating processes. For example, in response to an existence of the fluid leakage detected by the fluid leakage handling device, an on-going photoresist coating process conducted by the lithography apparatus can be aborted to avoid a contamination from the fluid leakage. In some embodiments, in response to discrete droplets of the fluid leakage being captured and detected by the fluid leakage handling device, an on-going photoresist coating process may continue to meet a manufacturing schedule and a subsequent photoresist coating processes can be aborted to avoid potential contamination from the fluid leakage. The adjustment can further include interlocking the operations of the lithography apparatus, such as triggering a preventive maintenance alert to replace the fluid conduit, replacing the fluid leakage handling device, aborting a photoresist coating process, and/or adjusting a manufacturing schedule of semiconductor device using the lithography apparatus. For example, the adjustment can notify supply-chain management to start preparing an inventory of a new fluid conduit or fluid leakage handling device.

Figure 4:
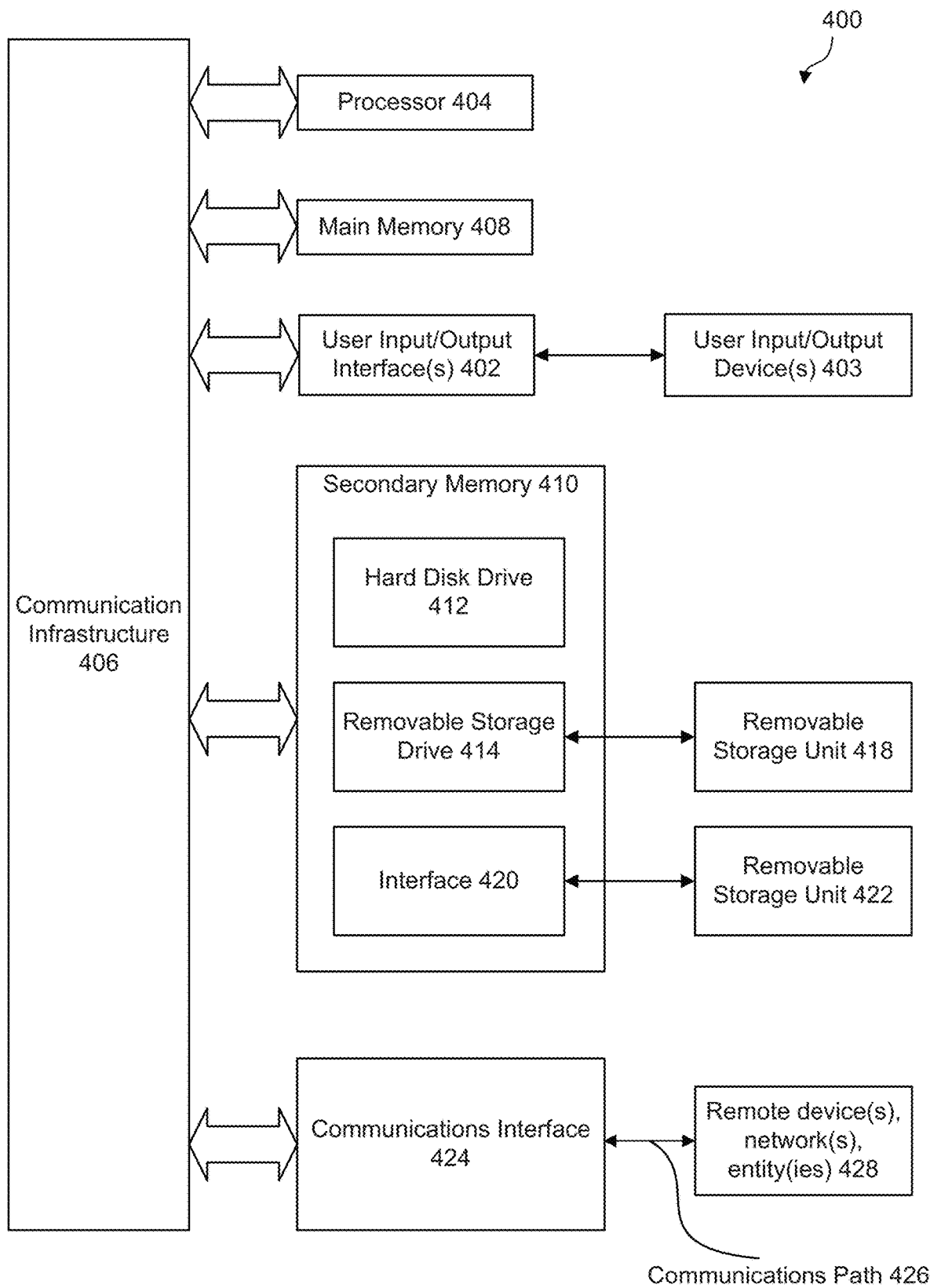
FIG. 4 illustrates a computer system for implementing various embodiments of the present disclosure, according to some embodiments.

FIG. 4 is an illustration of an example computer system 400 in which various embodiments of the present disclosure can be implemented, according to some embodiments. Computer system 400 can be used, for example, in controller unit 170 of FIG. 1. Computer system 400 can be any well-known computer capable of performing the functions and operations described herein. For example, and without limitation, computer system 400 can be capable of processing and transmitting signals. Computer system 400 can be used, for example, to execute one or more operations of lithography apparatus 100.

Computer system 400 includes one or more processors (also called central processing units, or CPUs), such as a processor 404. Processor 404 is connected to a communication infrastructure or bus 406. Computer system 400 also includes input/output device(s) 403, such as monitors, keyboards, pointing devices, etc., that communicate with communication infrastructure or bus 406 through input/output interface(s) 402. A control tool can receive instructions to implement functions and operations described herein—e.g., the functions of lithography apparatus 100 described in FIG. 1 and the method/process described in FIGS. 2A-2B—via input/output device(s) 403. Computer system 400 also includes a main or primary memory 408, such as random access memory (RAM). Main memory 408 can include one or more levels of cache. Main memory 408 has stored therein control logic (e.g., computer software) and/or data. In some embodiments, the control logic (e.g., computer software) and/or data can include one or more of the functions described above with respect to lithography apparatus 100. In some embodiments, processor 404 can be configured to execute the control logic stored in main memory 408.

Computer system 400 can also include one or more secondary storage devices or memory 410. Secondary memory 410 can include, for example, a hard disk drive 412 and/or a removable storage device or drive 414. Removable storage drive 414 can be a floppy disk drive, a magnetic tape drive, a compact disk drive, an optical storage device, tape backup device, and/or any other storage device/drive.

Removable storage drive 414 can interact with a removable storage unit 418. Removable storage unit 418 includes a computer usable or readable storage device having stored thereon computer software (control logic) and/or data. Removable storage unit 418 can be a floppy disk, magnetic tape, compact disk, DVD, optical storage disk, and/or any other computer data storage device. Removable storage drive 414 reads from and/or writes to removable storage unit 418 in a well-known manner.

According to some embodiments, secondary memory 410 can include other mechanisms, instrumentalities or other approaches for allowing computer programs and/or other instructions and/or data to be accessed by computer system 400. Such mechanisms, instrumentalities or other approaches can include, for example, a removable storage unit 422 and an interface 420. Examples of the removable storage unit 422 and the interface 420 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface. In some embodiments, secondary memory 410, removable storage unit 418, and/or removable storage unit 422 can include one or more of the functions described above with respect to the wet bench structure.

Computer system 400 can further include a communication or network interface 424. Communication interface 424 enables computer system 400 to communicate and interact with any combination of remote devices, remote networks, remote entities, etc. (individually and collectively referenced by reference number 428). For example, communication interface 424 can allow computer system 400 to communicate with remote devices 428 over communications path 426, which can be wired and/or wireless, and which can include any combination of LANs, WANs, the Internet, etc. Control logic and/or data can be transmitted to and from computer system 400 via communication path 426.

The functions/operations in the preceding embodiments can be implemented in a wide variety of configurations and architectures. Therefore, some or all of the operations in the preceding embodiments—e.g., the functions of lithography apparatus 100 described in FIGS. 1 and 2A-2B and the method/process described in FIG. 3—can be performed in hardware, in software or both. In some embodiments, a tangible apparatus or article of manufacture including a tangible computer useable or readable medium having control logic (software) stored thereon is also referred to herein as a computer program product or program storage device. This includes, but is not limited to, computer system 400, main memory 408, secondary memory 410 and removable storage units 418 and 422, as well as tangible articles of manufacture embodying any combination of the foregoing. Such control logic, when executed by one or more data processing devices (such as computer system 400), causes such data processing devices to operate as described herein. For example, the hardware/equipment can be connected to or be part of element 428 (remote device(s), network(s), entity(ies) 428) of computer system 400.

The present disclosure is directed to a handling fluid leakage of a semiconductor apparatus with a fluid leakage handling device. In some embodiments, the fluid leakage handling device can include a disc surrounding a circulation pipe of the semiconductor apparatus and a fluid leakage sensor disposed in the disc. The disc can collect a leaked coolant from the circulation pipe and the fluid leakage sensor can detect the leaked coolant collected in the disc and further communicate with a controller unit to adjust one or more operations of the semiconductor apparatus. A benefit of the present disclosure is to provide a handling mechanism to reconcile the coolant leakage failure of the semiconductor apparatus, hence improving semiconductor devices manufacturing yield and productivity.

In some embodiments, a lithography apparatus can include a chuck configured to hold a substrate, and a photoresist feeder configured to dispatch a coating material on one or more areas of the substrate. The photoresist feeder can include a photoresist cartridge configured to output the coating material, a conduit fluidly connected to the photoresist cartridge, and a fluid leakage handling device disposed above the chuck. The conduit can be configured to fluidly transport the coating material and circulate a coolant. The fluid leakage handling device can be configured to detect a fluid leakage from the conduit.

In some embodiments, a lithography apparatus can include a conduit configured to transport a coating material, a disc including a first recess region surrounding the conduit, and a first bulge region surrounding the first recess region.

In some embodiments, a method for operating a lithography apparatus can include capturing a fluid leakage from a conduit of the lithography apparatus, determining a fluid leakage signature in the lithography apparatus, and adjusting one or more operations of the lithography apparatus based on the fluid leakage signature.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus, comprising:
   a chuck configured to hold a substrate; and
   a photoresist feeder configured to dispatch a coating material on one or more areas of the substrate, wherein the photoresist feeder comprises:
      a photoresist cartridge configured to output the coating material;
      a conduit fluidly connected to the photoresist cartridge and configured to fluidly transport the coating material and circulate a coolant; and
      a fluid leakage handling device comprising:
         a disc disposed above the chuck, comprising a recess region surrounding the conduit, wherein the recess region comprises a groove structure disposed at a top surface of the recess region, and
         an electric-type fluid sensor configured to detect a fluid leakage from the conduit, wherein a portion of the electric-type fluid sensor surrounds the conduit.

2. The apparatus of claim 1, further comprising a spindle configured to rotate the chuck.

3. The apparatus of claim 1, further comprising a computer system configured to communicate with the photoresist feeder, the computer system comprising:
   a memory configured to store instructions for adjusting one or more operations of a lithography process; and
   a processor configured to determine a fluid leakage signature of the apparatus and update the instructions based on the determination of the fluid leakage signature.

4. The apparatus of claim 1, wherein the fluid leakage handling device surrounds and contacts an outer surface of the conduit.

5. The apparatus of claim 1, wherein the conduit comprises:
   a first pipe configured to circulate the coolant; and
   a second pipe surrounded by the first pipe and configured to transport the coating material.

6. The apparatus of claim 1, wherein the fluid leakage handling device is disposed over an outer surface of the conduit.

7. The apparatus of claim 1, wherein:
   the disc is configured to collect the fluid leakage from the conduit; and
   the electric-type fluid sensor is configured to detect the fluid leakage collected in the disc.

8. The apparatus of claim 7, wherein the disc further comprises a bulge region surrounding the recess region, wherein the electric-type fluid sensor is disposed in the recess region.

9. The apparatus of claim 7, wherein the electric-type fluid sensor comprises a plurality of conductive wires configured to detect a resistance change associated with the fluid leakage collected in the disc.

10. A lithography apparatus, comprising:
    a chuck configured to hold a substrate;
    a conduit configured to transport a coating material and a coolant;
    a disc disposed over the chuck, comprising:
       a first recess region surrounding the conduit, wherein the first recess region comprises a groove structure disposed at a top surface of the first recess region, and
       a first bulge region surrounding the first recess region; and
    an electric-type fluid leakage sensor surrounding the conduit and configured to detect the fluid leakage collected in the disc.

11. The lithography apparatus of claim 10, wherein the disc comprises a plurality of plates, wherein each of the plurality of plates comprises a second recess region and a second bulge region surrounding the second recess region.

12. The lithography apparatus of claim 10, wherein a top surface of the first recess region has a slanted top surface.

13. The lithography apparatus of claim 10, wherein the conduit comprises:
    a circulation pipe configured to circulate the coolant; and
    a photoresist pipe surrounded by the circulation pipe and configured to transport the coating material.

14. The lithography apparatus of claim 10, wherein the electric-type fluid leakage sensor is disposed in or above the first recess region.

15. The lithography apparatus of claim 10, wherein the electric-type fluid leakage sensor comprises a plurality of conductive wires configured to detect a resistance change associated with a fluid leak from the conduit.

16. An apparatus, comprising:
    a chuck configured to hold a substrate; and
    a photoresist feeder disposed over the chuck, wherein the photoresist feeder comprises:
       a photoresist cartridge configured to dispense a coating material towards the chuck;
       a conduit fluidly connected to the photoresist cartridge and configured to fluidly transport a coolant; and
       a fluid leakage handling device including:
          a disc disposed above the chuck, comprising a recess region surrounding the conduit, wherein the recess region comprises a groove structure disposed at a top surface of the recess region, and
          an electric-type fluid sensor surrounding the conduit and configured to detect a fluid leakage from the conduit.

17. The apparatus of claim 16, wherein the fluid leakage handling device further comprises a bulge region surrounding the recess region.

18. The apparatus of claim 16:
    the disc is configured to collect the fluid leakage from the conduit; and the electric-type fluid sensor is configured to detect the fluid leakage collected in the disc.

19. The apparatus of claim 18, wherein the electric-type fluid sensor comprises a conductive wire disposed over a top surface of the disc and configured to detect a resistance change associated with the fluid leakage collected in the disc.

20. The apparatus of claim 1, wherein the portion of the electric-type fluid sensor surrounds the conduit is located in the groove structure.

* * * * *